US012686919B2

(12) United States Patent
Cai et al.

(10) Patent No.: US 12,686,919 B2
(45) Date of Patent: Jul. 21, 2026

(54) DEPOSITION MACHINE EXHAUST GAS PIPELINE AND OPERATION METHOD THEREOF

(71) Applicant: United Semiconductor (Xiamen) Co., Ltd., Xiamen (CN)

(72) Inventors: Jianping Cai, Shamen City (CN);
Chih-Chien Huang, Tainan City (TW);
Wen Yi Tan, Xiamen (CN)

(73) Assignee: United Semiconductor (Xiamen) Co., Ltd., Xiamen (CN)

( * ) Notice: Subject to any disclaimer, the term of this patent is extended or adjusted under 35 U.S.C. 154(b) by 839 days.

(21) Appl. No.: 17/669,372

(22) Filed: Feb. 11, 2022

(65) Prior Publication Data

US 2023/0203650 A1     Jun. 29, 2023

(30) Foreign Application Priority Data

Dec. 24, 2021     (CN) .......................... 202111598291.5

(51) Int. Cl.
*C23C 16/44*          (2006.01)
*C23C 16/458*        (2006.01)

(52) U.S. Cl.
CPC ...... *C23C 16/4412* (2013.01); *C23C 16/4583* (2013.01)

(58) Field of Classification Search
None
See application file for complete search history.

(56) References Cited

U.S. PATENT DOCUMENTS

| | | | |
|---|---|---|---|
| 2007/0095282 A1* | 5/2007 | Moon ................. | C23C 16/4412 |
| | | | 118/715 |
| 2014/0041585 A1* | 2/2014 | Hsu ..................... | C23C 16/4412 |
| | | | 118/715 |
| 2022/0037169 A1* | 2/2022 | Yang ................... | C23C 16/4412 |

* cited by examiner

*Primary Examiner* — Binu Thomas
(74) *Attorney, Agent, or Firm* — Winston Hsu

(57)          ABSTRACT

The invention provides a deposition machine, which comprises a chamber, a first pipeline and a second pipeline, wherein one end of the first pipeline and one end of the second pipeline are connected to the chamber, and a part of the second pipeline passes through a sidewall of the first pipeline and extends into the interior of the first pipeline. The deposition machine has the advantages of reducing the risk of pipeline blockage.

6 Claims, 4 Drawing Sheets

DEPOSITION MACHINE EXHAUST GAS PIPELINE AND OPERATION METHOD THEREOF

CROSS REFERENCE TO RELATED APPLICATIONS

This application claims priority to China Patent Application No. 202111598291.5, filed on 2021 Dec. 24, the entire contents of which are incorporated herein by reference.

BACKGROUND OF THE INVENTION

1. Field of the Invention

The invention relates to the semiconductor field, in particular to an improved deposition machine, which can reduce the risk of pipeline blockage in the deposition process.

2. Description of the Prior Art

Deposition process is a very common technology in the semiconductor filed, which is used to form various material layers on the substrate or to form a stacked structure of material layers. Therefore, the deposition machine usually runs for a long time to maintain the product process efficiency.

However, the deposition machine must be maintained after being used for a period of time, such as cleaning the chamber. The more times the machine is maintained, the more times the process is interrupted. Therefore, how to reduce the maintenance times of the machine without affecting the efficiency of the machine is a goal worthy of study in this field.

SUMMARY OF THE INVENTION

The invention provides a deposition machine, which comprises a chamber, a first pipeline and a second pipeline, one end of the first pipeline and one end of the second pipeline are connected to the chamber, and a part of the second pipeline passes through a sidewall of the first pipeline and extends into the interior of the first pipeline.

The invention also provides an operation method of the deposition machine, which comprises providing a chamber, providing a first pipeline and a second pipeline, one end of the first pipeline and one end of the second pipeline are connected to the chamber, a part of the second pipeline passes through a sidewall of the first pipeline and extends into the interior of the first pipeline, providing a wafer to be placed in the chamber, and performing a deposition step.

The invention is characterized in that the first pipeline connecting the chamber and providing the main direction of deposition airflow and the second pipeline providing the vacuum adsorption function of the heating seat (wafer holder) in the chamber share the same pump, and the end of the second pipeline is easily blocked by the deposition under the conventional situation. According to the invention, the end of the second pipeline is extended to the inside of the first pipeline, so that the issue that the end of the second pipeline is blocked by sediments can be greatly reduced, the number of times that the deposition machine needs to be maintained caused by the pipeline is blocked can be reduced, and the overall process efficiency can be improved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
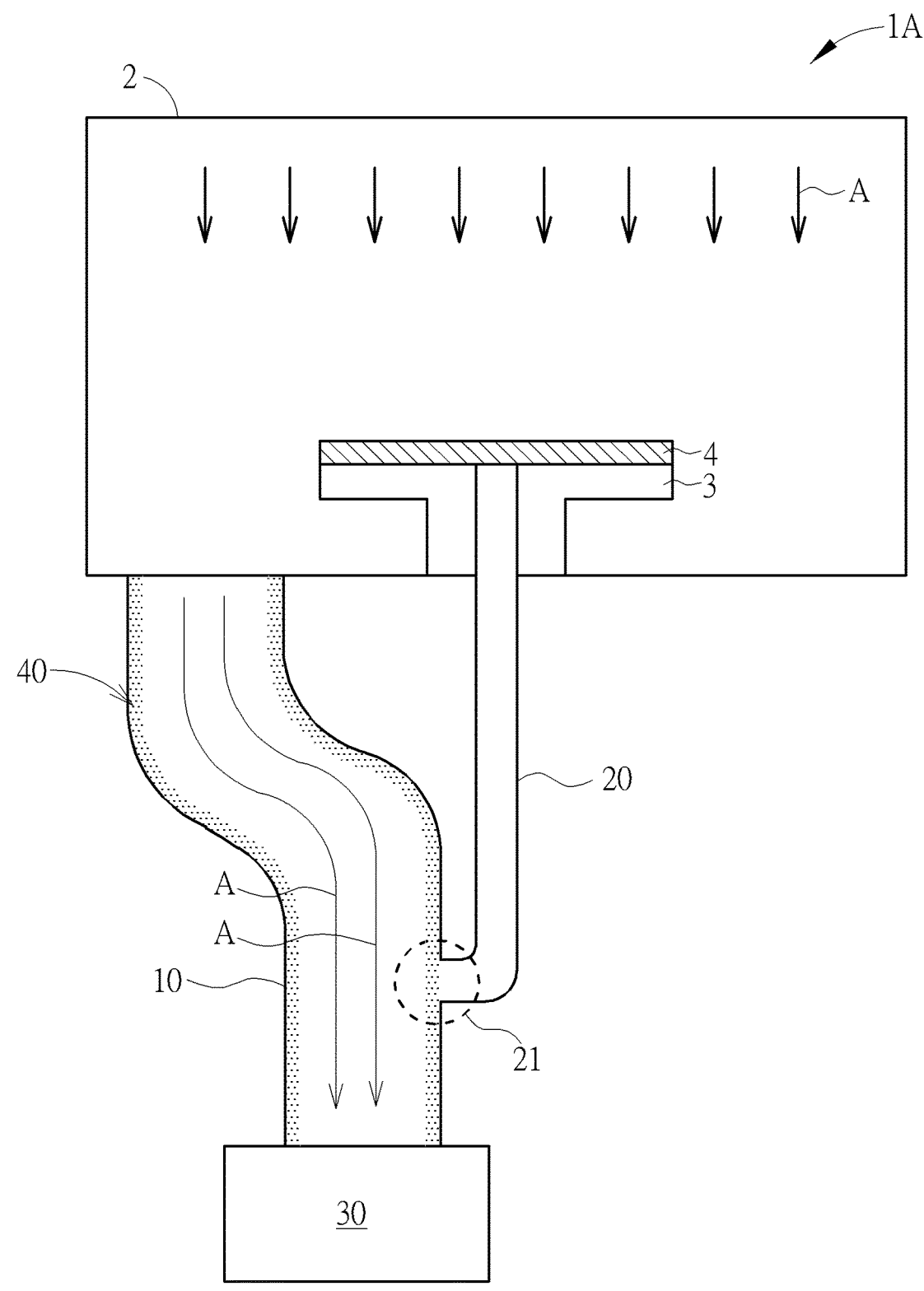
FIG. 1 is a schematic structural diagram of a deposition machine according to an embodiment of the present invention.

Please refer to FIG. 1, which shows a schematic structural diagram of a deposition machine according to an embodiment of the present invention. First, the deposition machine 1A includes a chamber 2, in which there is a wafer holder 3, and a wafer 4 can be placed above the wafer holder 3. In addition, the chamber 2 is connected with the first pipeline 10 and the second pipeline 20. One end (for example, the upper end) of the first pipeline 10 and one end of the second pipeline 20 are connected to the chamber 2, while the other end of the first pipeline 10 and the other end of the second pipeline 20 are connected together (for example, the lower end) and then connected to a pump 30, so both the first pipeline 10 and the second pipeline 20 are pumped by the pump 30. The first pipeline 10 is used to provide a fixed air flow direction during the deposition step, and to pump out process gases from the chamber 2 during the deposition step, while the second pipeline 20 is connected to the wafer holder 3. When the wafer 4 is placed above the wafer holder 3, it will be sucked by the second pipeline 20 in a suction manner (that is, vacuum adsorption), so as to avoid the displacement of the wafer 4 caused by the disturbance of air flow in the chamber 2 during the deposition step. Therefore, the pipe diameter of the first pipeline 10 will generally be larger than that of the second pipeline 20, but the present invention is not limited to this.

As shown in FIG. 1, in this embodiment, the end 21 of the second pipeline 20 is connected to the sidewall of the first pipeline 10, so that one end of the first pipeline 10 and the second pipeline 20 are connected together and share the pumping function of the pump 30. In FIG. 1, the direction of the airflow in the pipeline is indicated by arrow A. However, the applicant has found that there is a problem with the structure of this embodiment, that is, after the deposition step is carried out for a period of time, sediments 40 will be generated or deposited on the inner wall of the first pipeline 10 and block the end 21 of the second pipeline 20. That is to say, if the end 21 of the second pipeline 20 is blocked by the sediments 40 after the deposition step has been carried out for a period of time, the wafer holder 3 will lose the vacuum adsorption function, which may cause the wafer 4 to be unable to be fixed on the wafer holder 3, and it may lead to displacement during the deposition process, resulting in the degradation of the process quality.

To solve the above problems, one of the methods is to suspend the process of the deposition machine and maintain the machine, so as to clean the sediments 40 in the first pipeline 10. However, frequent machine maintenance will also affect the efficiency of the whole process.

Therefore, another embodiment of the present invention provides an improved deposition machine, which can reduce the probability that the end of the second pipeline is blocked without affecting the function of the deposition machine, thereby reducing the maintenance times of the machine and improving the process efficiency.

Figure 2:
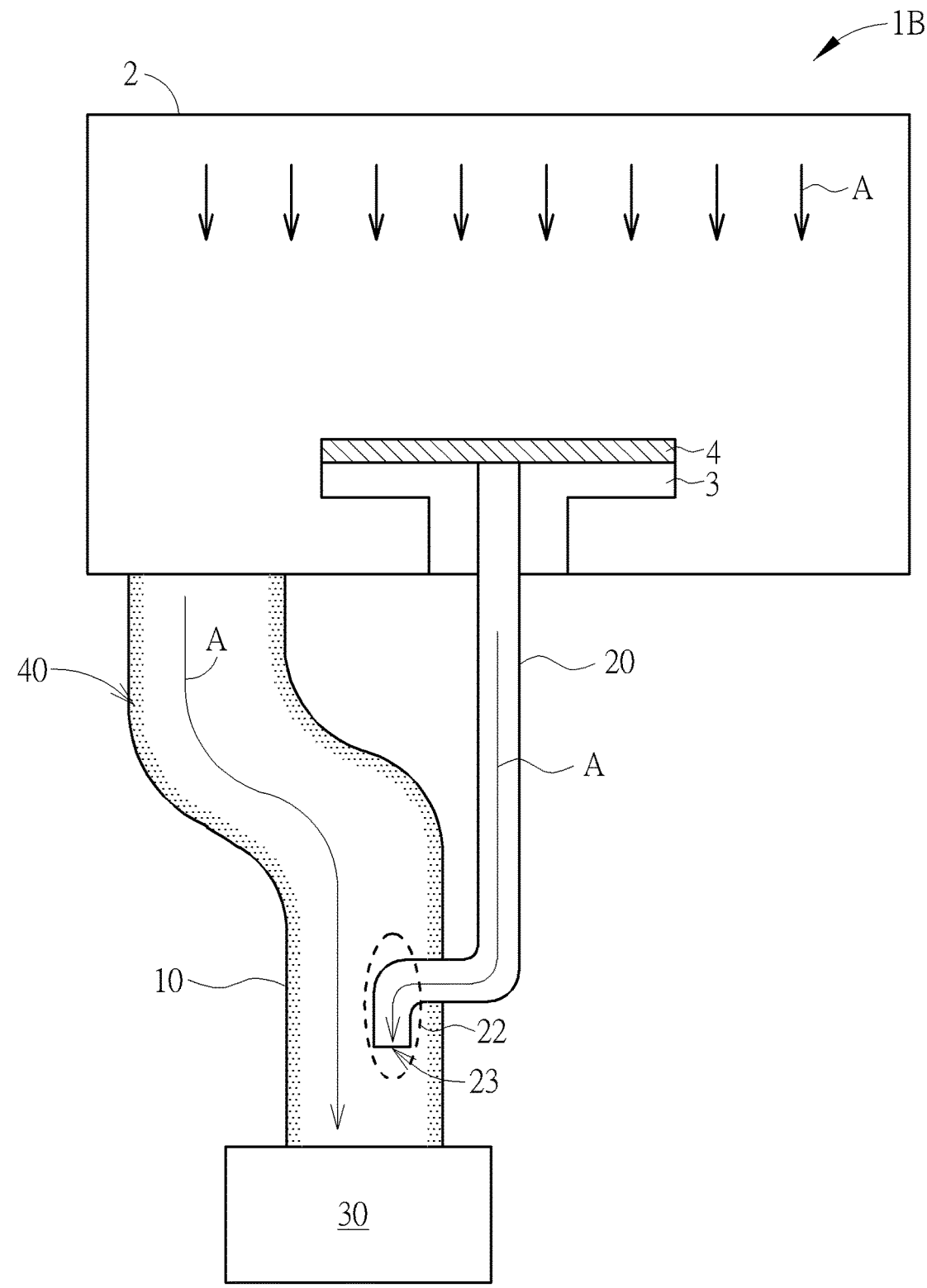
FIG. 2 is a schematic structural diagram of a deposition machine according to another embodiment of the present invention.

As shown in FIG. 2, FIG. 2 shows a schematic structural diagram of a deposition machine according to another embodiment of the present invention. In this embodiment, the deposition machine 1B also includes a chamber 2, a wafer holder 3, a wafer 4, a first pipeline 10, a second pipeline 20 and a pump 30. The same elements are not repeated here. This embodiment is different from the above embodiments in that the end of the second pipeline 20 has an extension part 22, the extension part 22 is located inside the first pipeline 10 and extends towards the interior portion of the first pipeline 10. In this way, even if the sediments 40 is stacked on the inner wall of the first pipeline 10, the sediments 40 will not easily block the second pipeline 20 because the extension part 22 extends from the inner wall of the first pipeline 10 to the middle portion. In addition, in this embodiment, the extension part 22 of the second pipeline 20 has a turning structure, in which the end 23 of the extension part 22 is preferably parallel to the sidewall of the first pipeline 10, and the end 23 turn towards the direction of the pump 30. Therefore, the sediments 40 in the first pipeline 10 driven by the airflow A is not easy to enter the extension part 22 of the second pipeline 20, and the risk of blockage of the second pipeline 20 can be further effectively reduced. According to the applicant's experimental results, the second pipeline 20 may be blocked after about one process cycle of the deposition machine shown in FIG. 1, but this embodiment (the deposition machine shown in FIG. 2) can keep the second pipeline 20 from being blocked after several process cycles, thus greatly reducing the risk of blocking the second pipeline 20.

It should be noted that the turning angle of the extension part 22 mentioned above is only one example of the present invention, and the present invention is not limited to the angle of the turning structure of the extension part 22 in the first pipeline 10 being parallel to the first pipeline 10. In other embodiments of the present invention, the extension part 22 can be arranged in the first pipeline 10 at other angles, which is also within the scope of the present invention.

Figure 3:
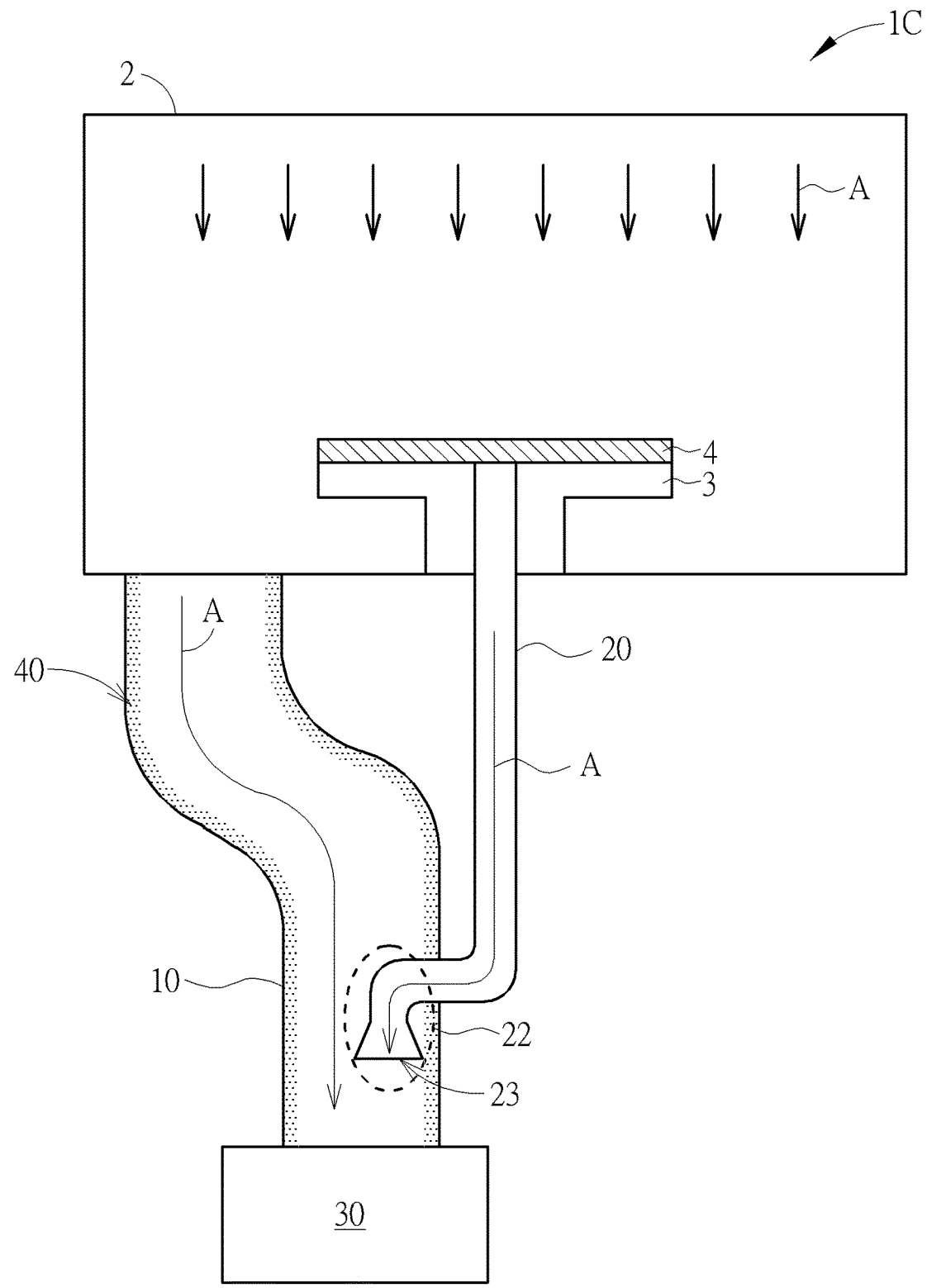
FIG. 3 is a schematic structural diagram of a deposition machine according to another embodiment of the present invention.

In another embodiment of the present invention, as shown in FIG. 3, FIG. 3 shows a schematic structural diagram of a deposition machine according to another embodiment of the present invention. In this embodiment, the structure of the deposition machine 1C is substantially similar to that of the deposition machine 1B of the second embodiment, except that the pipe diameter of the end of the extension part 22 of the second pipeline 20 is enlarged in this embodiment, that is, the pipe diameter of the end of the extension part 22 located in the first pipeline 10 is larger than that of the rest of the second pipeline 20 (the part outside the first pipeline 10) or the average diameter of the second pipeline 20. Enlarging the diameter of the end of the extension part 22 is helpful to further reduce the risk of the second pipeline 20 being blocked. This embodiment is also within the scope of the present invention. Other features are the same as those described in the above embodiments, so they will not be repeated here.

Figure 4:
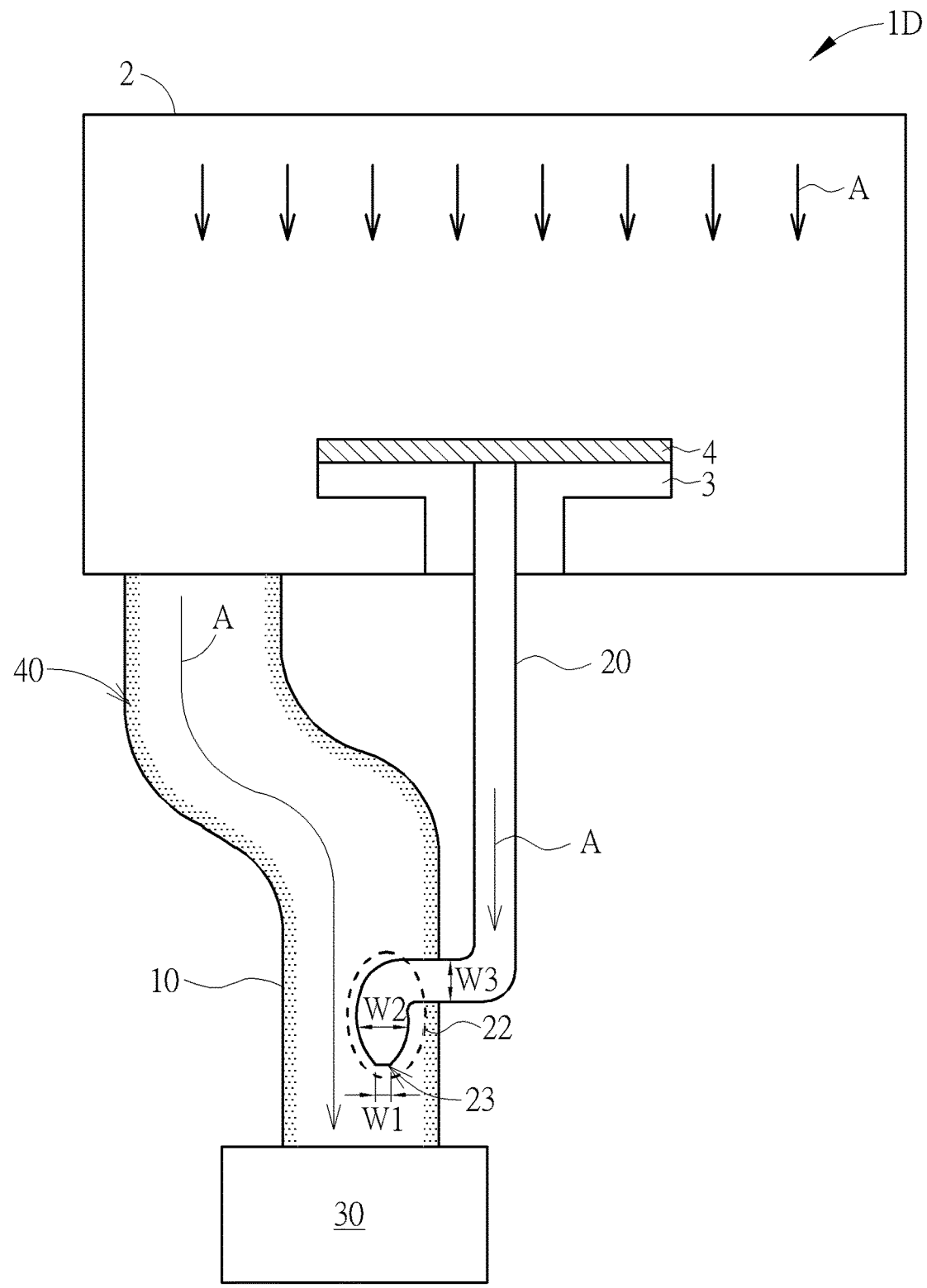
FIG. 4 is a schematic structural diagram of a deposition machine according to another embodiment of the present invention.

In another embodiment of the present invention, as shown in FIG. 4, FIG. 4 shows a schematic structural diagram of a deposition machine according to another embodiment of the present invention. In this embodiment, the structure of the deposition machine 1D is substantially similar to that of the deposition machine 1B of the second embodiment described above, except that the extension part 22 of the second pipeline 20 in this embodiment is designed in a streamlined shape. For example, the diameter of the end 23 is W1, the diameter of the middle part of the extension part 22 is W2, and the diameter of the part of the second pipeline 20 outside the first pipeline 10 is W3, and in this embodiment, W2>W3>W1. By designing the extension part 22 in streamline shape, the air pressure influence caused by the extension part 22 in the first pipeline 10 can be reduced, and the sediments 40 is less likely to attach to the streamline-shaped extension part 22. This embodiment is also within the scope of the present invention. Other features are the same as those described in the above embodiments, so they will not be repeated here.

Based on the above description and drawings, the present invention provides a deposition machine (deposition machine 1B, deposition machine 1C or deposition machine 1D), which comprises a chamber 2, a first pipeline 10 and a second pipeline 20, wherein one end of the first pipeline 10 and one end of the second pipeline 20 are connected to the chamber 2, and a part of the second pipeline 20 passes through a sidewall of the first pipeline 10 and extends into the first pipeline 10.

In some embodiments of the present invention, a diameter of the first pipeline 10 is larger than a diameter of the second pipeline 20.

In some embodiments of the present invention, the part of the second pipeline 20 inside the first pipeline 10 is defined as an extension part 22, and the extension part 22 includes a turning structure.

In some embodiments of the present invention, the other end of the first pipeline 10 is connected with a pump 30.

In some embodiments of the present invention, one end 23 of the extension part 22 turns towards the pump 30.

In some embodiments of the present invention, a diameter of the end 23 of the extension part 22 of the second pipeline 20 is larger than a diameter of a part of the second pipeline 20 located outside the first pipeline 10 (as shown in FIG. 3).

In some embodiments of the present invention, the extension part 22 has a streamline shape (as shown in FIG. 4).

In some embodiments of the present invention, a wafer holder 3 is located in the chamber 2, and one end of the second pipeline 20 connecting the chamber 2 is connected to the wafer holder 3.

The invention also provides an operation method of the deposition machine, which comprises providing a chamber 2, providing a first pipeline 10 and a second pipeline 20, one end of the first pipeline 10 and one end of the second pipeline 20 are connected to the chamber 2, a part of the second pipeline 20 passes through a sidewall of the first pipeline 10 and extends into the interior of the first pipeline 10, providing a wafer 4 to be placed in the chamber 2, and performing a deposition step.

The invention is characterized in that the first pipeline connecting the chamber and providing the main direction of deposition airflow and the second pipeline providing the vacuum adsorption function of the heating seat in the chamber share the same pump, and the end of the second pipeline is easily blocked by the deposition under the conventional situation. According to the invention, the end of the second pipeline is extended to the inside of the first pipeline, so that the issue that the end of the second pipeline is blocked by sediments can be greatly reduced, the number of times that the deposition machine needs to be maintained caused by the pipeline is blocked can be reduced, and the overall process efficiency can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A deposition machine, comprising:
a chamber; and a first pipeline and a second pipeline, wherein one end of the first pipeline and a first end of the second pipeline are connected to the chamber, wherein a part of the second pipeline passes through a sidewall of the first pipeline and extends into the interior of the first pipeline, wherein the part of the second pipeline inside the first pipeline is defined as an extension part, wherein the extension part has a second end having a single opening, and wherein a diameter of the single opening is W1, a diameter of the middle part of the extension part is W2, and a diameter of the part of the second pipeline outside the first pipeline is W3, and W2>W3>W1.

2. The deposition machine according to claim 1, wherein a diameter of the first pipeline is larger than a diameter of the second pipeline.

3. The deposition machine according to claim 1, wherein the extension part includes a turning structure.

4. The deposition machine according to claim 3, wherein the other end of the first pipeline is connected with a pump.

5. The deposition machine according to claim 4, wherein one end of the extension part turn towards the pump.

6. The deposition machine according to claim 1, further comprising a wafer holder in the chamber, and the end of the second pipeline connecting the chamber is connected to the wafer holder.

* * * * *